(12) United States Patent
Wang et al.

(10) Patent No.: US 12,143,094 B2
(45) Date of Patent: Nov. 12, 2024

(54) BULK ACOUSTIC WAVE FILTER AND METHOD OF MANUFACTURING BULK ACOUSTIC WAVE FILTER

(71) Applicant: Epicmems(Xiamen) Co., Ltd., Fujian (CN)

(72) Inventors: Wei Wang, Fujian (CN); Ping Li, Fujian (CN); Nianchu Hu, Fujian (CN); Bin Jia, Fujian (CN)

(73) Assignee: Epicmems(Xiamen) Co., Ltd., Fujian (CN)

( * ) Notice: Subject to any disclaimer, the term of this patent is extended or adjusted under 35 U.S.C. 154(b) by 443 days.

(21) Appl. No.: 17/621,367

(22) PCT Filed: Jul. 10, 2019

(86) PCT No.: PCT/CN2019/095424
§ 371 (c)(1),
(2) Date: Dec. 21, 2021

(87) PCT Pub. No.: WO2021/003699
PCT Pub. Date: Jan. 14, 2021

(65) Prior Publication Data
US 2022/0376672 A1    Nov. 24, 2022

(51) Int. Cl.
*H03H 3/02* (2006.01)
*H03H 9/17* (2006.01)
(Continued)

(52) U.S. Cl.
CPC .............. *H03H 9/173* (2013.01); *H03H 3/02* (2013.01); *H03H 9/205* (2013.01); *H03H 9/587* (2013.01); *H03H 2003/021* (2013.01)

(58) Field of Classification Search
CPC .......... H03H 9/173; H03H 3/02; H03H 9/205; H03H 9/587; H03H 9/131; H03H 3/04;
(Continued)

(56) References Cited

U.S. PATENT DOCUMENTS 5,920,242 A   7/1999   Oya et al.
6,441,703 B1 *  8/2002  Panasik ................. H03H 9/589
                                                              29/25.35
(Continued)

FOREIGN PATENT DOCUMENTS

CN    107094004 A    8/2017
CN    208143193 U   11/2018

OTHER PUBLICATIONS

PCT International Search Report for PCT Application No. PCT/CN2019/095424 mailed Apr. 8, 2020 (6 pages, with English translation).

(Continued)

*Primary Examiner* — Donghai D Nguyen
(74) *Attorney, Agent, or Firm* — Merchant & Gould P.C.

(57) ABSTRACT

A method of manufacturing a bulk acoustic wave filter is provided, including: forming an acoustic reflection air cavity, a sacrificial layer, a seed layer, a lower electrode layer and a piezoelectric layer of n resonators on a substrate in sequence, wherein n is greater than or equal to 2; taking N from 1 to n for respectively repeating following steps: forming an N-th metal hard mask layer, defining an effective area of a first resonator to an N-th resonator by using a photolithography process, removing the N-th metal hard mask layer outside the effective area of the first resonator to the N-th resonator, oxidizing the piezoelectric layer outside the effective area of the first resonator to the N-th resonator to form an N-th oxidized part of the piezoelectric layer, and etching the N-th oxidized part of the piezoelectric layer; removing the metal hard mask layer of the effective area of the first resonator to the N-th resonator, so as to form the piezoelectric layer having different thicknesses of the first resonator to the N-th resonator; and forming an upper (Continued)

electrode layer on the piezoelectric layer having different thicknesses of the first resonator to the N-th resonator.

9 Claims, 8 Drawing Sheets

(51) Int. Cl.
  *H03H 9/205* (2006.01)
  *H03H 9/58* (2006.01)
(58) Field of Classification Search
  CPC ...... H03H 2003/021; H03H 2003/0414; Y10T 29/42; Y10T 29/49005
  See application file for complete search history.

(56) References Cited

U.S. PATENT DOCUMENTS

| | | | |
|---|---|---|---|
| 6,566,979 B2* | 5/2003 | Larson, III | H03H 9/564 |
| | | | 29/25.35 |
| 10,211,810 B2* | 2/2019 | Jeung | H03H 9/205 |
| 2002/0089395 A1 | 7/2002 | Ella et al. | |
| 2008/0129412 A1 | 6/2008 | Osone et al. | |

OTHER PUBLICATIONS

PCT Written Opinion for PCT Application No. PCT/CN2019/095424 mailed Apr. 8, 2020 (3 pages).

\* cited by examiner

BULK ACOUSTIC WAVE FILTER AND METHOD OF MANUFACTURING BULK ACOUSTIC WAVE FILTER

CROSS-REFERENCE TO RELATED APPLICATIONS

This application is a National Stage of PCT/CN2019/095424, filed Jul. 10, 2019, all the contents of which are incorporated herein by reference in their entirety.

TECHNICAL FIELD

The present disclosure relates to a field of acoustic transducing, in particular to a bulk acoustic wave filter and a method of manufacturing a bulk acoustic wave filter.

BACKGROUND

A transducer usually converts electrical signals into mechanical signals or vibrations, or converts mechanical signals or vibrations into electrical signals. In particular, an acoustic transducer converts electrical signals into acoustic signals (acoustic waves) using inverse piezoelectric effect, and converts received acoustic waves into electrical signals via piezoelectric effect. The acoustic transducer usually includes acoustic resonators such as surface acoustic wave (SAW) resonators, bulk acoustic wave (BAW) resonators, etc.

The bulk acoustic wave resonator (BAW), which is manufactured by using longitudinal resonance of piezoelectric film in a thickness direction, has become a feasible alternative to surface acoustic wave devices and quartz crystal resonators in mobile phone communication and high-speed serial data applications, etc. A RF front-end bulk acoustic wave filter/duplexer provides excellent filtering characteristics, such as low insertion loss, steep transition band, large power capacity and strong anti-electrostatic discharge (ESD) ability. A high frequency film bulk acoustic wave oscillator with ultra-low frequency temperature drift has low phase noise, low power consumption and wide bandwidth modulation range. In addition, these micro film resonators use CMOS compatible processing technology on a silicon substrate, which may reduce a unit cost and facilitate a final integration with CMOS circuits.

Topology structures that use resonators to design RF filters mainly include trapezoidal structure and grid structure. At present, a design method of trapezoidal structure is popular in designing high-performance RF filters. The bulk acoustic wave (BAW) resonator is a piezoelectric acoustic wave resonator, which mainly includes film bulk acoustic resonator FBAR and solidity mounted resonator SMR. The bulk acoustic wave resonator is famous for its high quality factor. A band-pass filter containing one or more bulk acoustic wave resonators has become a strong competitor in filtering technology relative to existing surface acoustic wave SAW resonators and ceramic resonators.

SUMMARY

A method of manufacturing a bulk acoustic wave filter is provided to at least partially solve the problem above.

According to one aspect of the present disclosure, a method of manufacturing a bulk acoustic wave filter is provided, including:

forming an acoustic reflection air cavity, a sacrificial layer, a seed layer, a lower electrode layer and a piezoelectric layer of n resonators on a substrate in sequence, wherein n is greater than or equal to 2;

taking N from 1 to n for respectively repeating following steps:
forming an N-th metal hard mask layer,
defining an effective area of a first resonator to an N-th resonator by using a photolithography process,
removing the N-th metal hard mask layer outside the effective area of the first resonator to the N-th resonator,
oxidizing the piezoelectric layer outside the effective area of the first resonator to the N-th resonator to form an N-th oxidized part of the piezoelectric layer, and
etching the N-th oxidized part of the piezoelectric layer,
removing the metal hard mask layer of the effective area of the first resonator to the N-th resonator, so as to form the piezoelectric layer having different thicknesses of the first resonator to the N-th resonator; and
forming an upper electrode layer on the piezoelectric layer having different thicknesses of the first resonator to the N-th resonator.

Further, an effective area pattern of the first resonator to the N-th resonator is defined by using a photoresist when forming the N-th metal hard mask layer; and the photoresist is removed by using an O2 plasma environment, and the piezoelectric layer outside the effective area of the first resonator to the N-th resonator is oxidized to form the N-th oxidized part of the piezoelectric layer.

Further, a thickness of the oxidized part of the piezoelectric layer is changed by controlling a temperature of the $O_2$ plasma and a treatment time, and the oxidized part of the piezoelectric layer is etched by HF.

Further, after the N-th metal hard mask layer outside the effective area of the first resonator to the N-th resonator is removed, the N-th oxidized part of the piezoelectric layer is formed and etched for a plurality of times, and a thickness of the piezoelectric layer is measured after each etching.

Further, after the acoustic reflection air cavity is formed, the sacrificial layer is formed on the substrate, an upper surface of the sacrificial layer in the acoustic reflection air cavity is in the same plane with an upper surface of the substrate outside the acoustic reflection air cavity by using a CMP process, and then the seed layer and the lower electrode layer are formed on the upper surface of the sacrificial layer; and parts of a material of the lower electrode layer and a material of the seed layer is removed by using the photolithography and etching process to form a lower electrode pattern, the lower electrode pattern is defined by using the photoresist when etching the material of the lower electrode layer, and then a dry etching process is used, wherein etching gases include $SF_6$ and $O_2$, an etching rate of the photoresist is greater than an etching rate of the lower electrode layer by adjusting a proportion of the etching gas $O_2$, the photoresist is etched by an $O_2$ plasma and gradually shrinks inward to form a slope shaped lower electrode etching morphology, wherein a slope gradient of the slope is 15°-20°.

Further, after forming the upper electrode layer, the method further includes: defining an area where the upper electrode is electrically coupled to the lower electrode by the photolithography process, removing the piezoelectric layer of the area where the upper electrode is electrically coupled to the lower electrode, and exposing an air cavity releasing channel with the sacrificial layer removed.

Further, after exposing the air cavity releasing channel with the sacrificial layer removed, the method further includes: forming electrical coupling layers on the lower electrode and the upper electrode respectively.

Further, a material of the sacrificial layer includes phosphorus doped silicon oxide, metal or polymer; a material of the seed layer and the piezoelectric layer includes AlN; a material of the lower electrode layer and the metal hard mask layer material includes molybdenum; a material of the upper electrode layer includes molybdenum or aluminum, and a material of the electrical coupling layer includes TiW, Al, Cu, Au or CR.

Further, the acoustic reflection air cavity is formed by the photolithography, dry etching or wet etching process;

the sacrificial layer is formed by sputtering, chemical vapor deposition, physical vapor deposition, or spin coating process; and the seed layer and the lower electrode layer are formed by a sputtering process.

According to another aspect of the present disclosure, a bulk acoustic wave filter is provided, which is manufactured by the method for manufacturing a bulk acoustic wave filter.

BRIEF DESCRIPTION OF THE DRAWINGS

The accompanying drawings forming part of the present disclosure are used to provide a further understanding of the present disclosure. The schematic embodiments of the present disclosure and descriptions thereof are used to explain the present disclosure and do not constitute an improper limitation of the present disclosure. In the drawings.

DETAILED DESCRIPTION OF EMBODIMENTS

It should be noted that the embodiments in the present disclosure and the features in the embodiments may be combined with each other without conflict.

Figure 1:
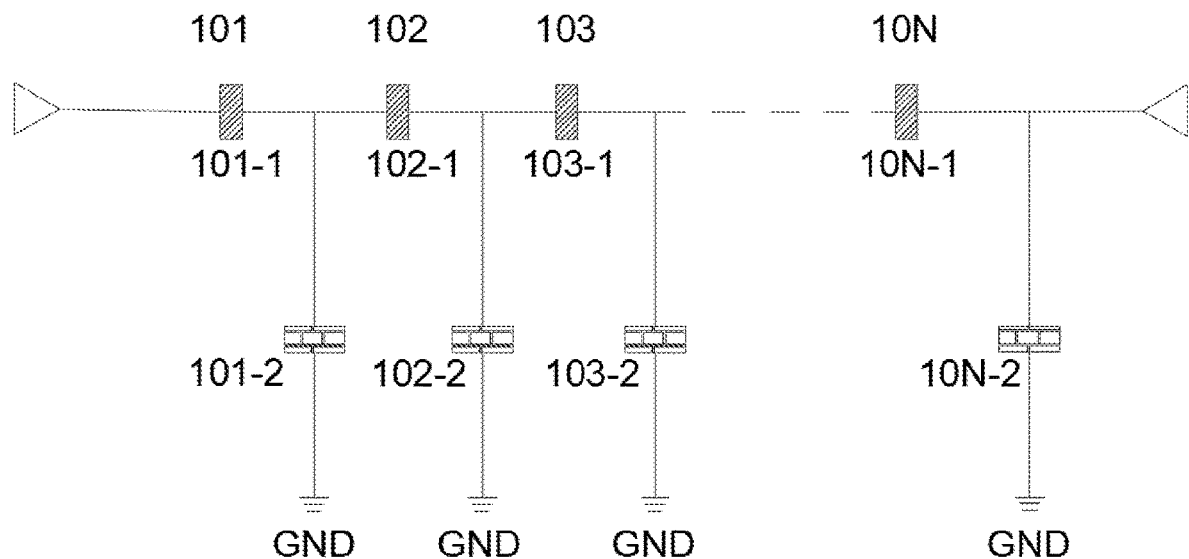
FIGS. 1-3 are structural diagrams of an existing bulk acoustic wave filter.
Figure 2:
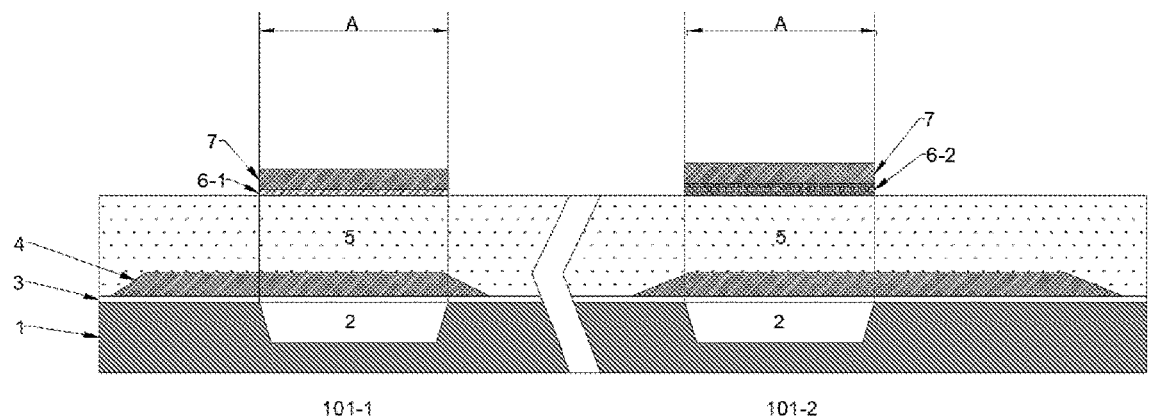
Figure 3:
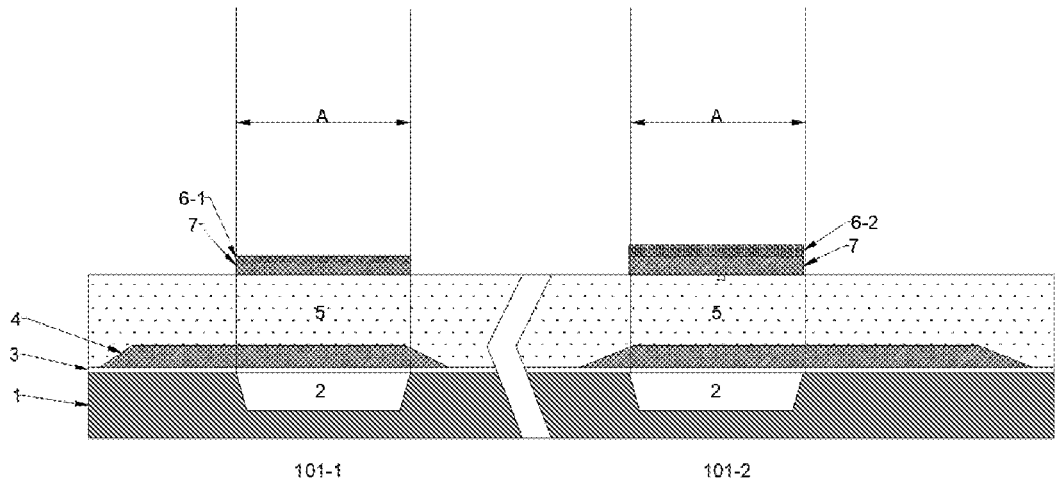
Figure 4:
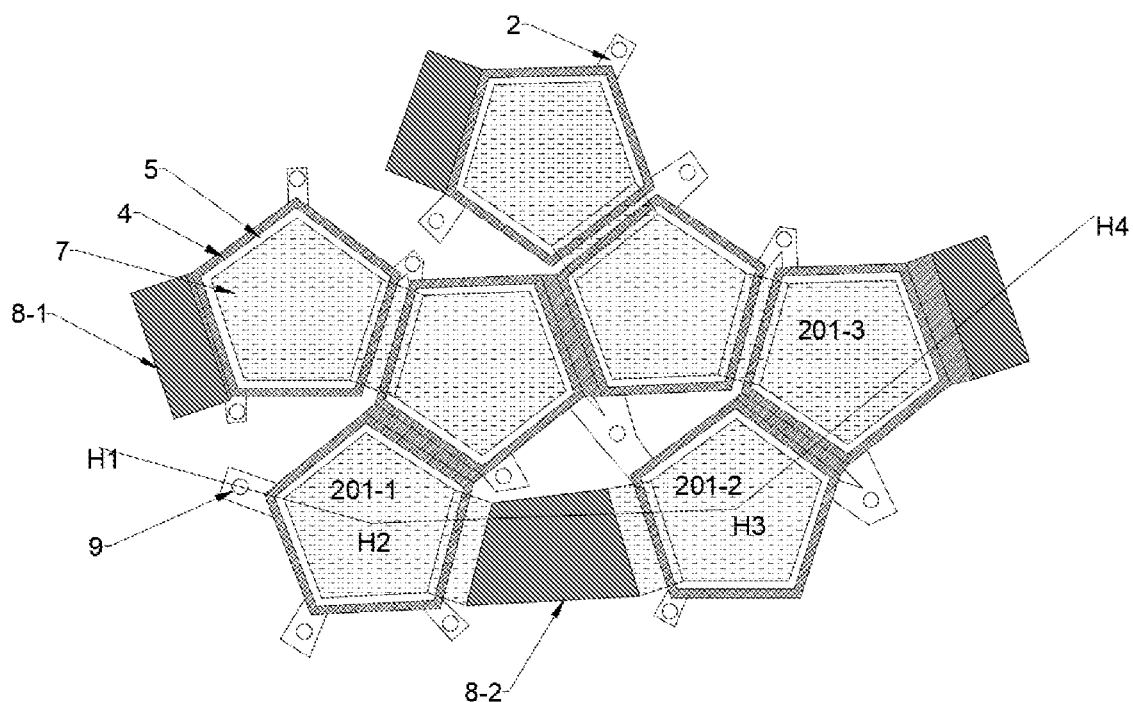
FIG. 4 is a sectional structure diagram of a bulk acoustic wave filter along a plan H1-H2-H3-H4 of the present disclosure.
Figure 5:
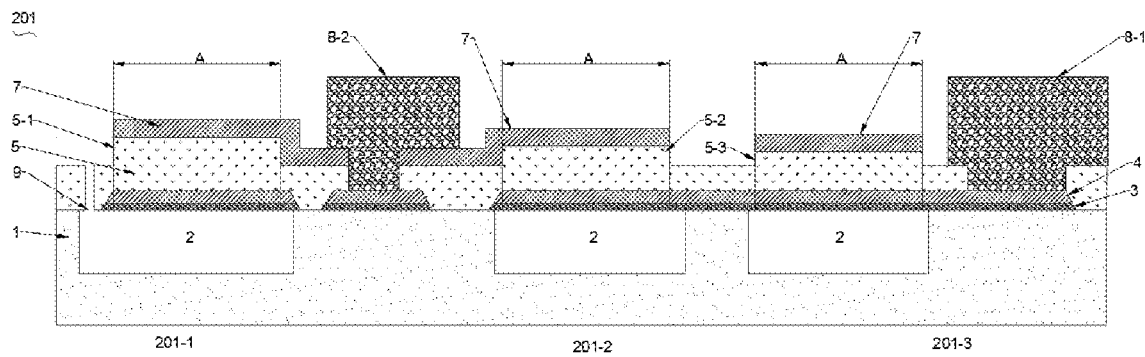
FIGS. 5-21 are sectional views of a manufacturing process of a bulk acoustic wave filter along the plan H1-H2-H3-H4 of the present disclosure.

FIGS. 1-3 are structural diagrams of an existing bulk acoustic wave filter. As shown in FIG. 1, a trapezoidal acoustic wave filter includes acoustic bandpass filter units 101, 102 . . . 10N in cascade. The acoustic bandpass filter unit 101 includes a series resonator 101-1 coupled to a series branch and a parallel resonator 101-2 coupled to a parallel branch. The acoustic bandpass filter units 102, 103 . . . 10N are similar to the acoustic bandpass filter unit 101. In FIG. 1, the series resonators 101-1, 102-1 . . . 10N-1 and the parallel resonators 101-2, 102-2 . . . 10N-2 constituting the acoustic bandpass filter units 101, 102 . . . 10N may be film bulk acoustic resonators (FBAR) or solidity mounted resonators (SMR).

According to needs of filter passband insertion loss and out-passband suppression, frequencies of the series resonators 101-1, 102-1 . . . 10N-1 may be the same or different, and frequencies of the parallel resonators 101-2, 102-2 . . . 10N-2 may be the same or different. However, sometimes in order to design a filter with higher out-band suppression and flatter insertion loss curve, cascaded resonators with similar resonant frequencies are often used.

In order to obtain different resonant frequencies on different resonators, existing technologies generally use electrode materials to form mass loads at the bottom or top of upper electrodes of different resonators.

FIG. 2 and FIG. 3 show a structural unit of bulk acoustic wave filter commonly used in the existing technologies. Generally, an air cavity 2 is formed in a silicon substrate 1, next, a sacrificial layer material is filled in the air cavity to form a flat surface after CMP (chemical mechanical polish) process, then, a seed layer (ALN) 3, a lower electrode 4, a piezoelectric layer 5, an upper electrode 7, and mass load layers 6-1 and 6-2 that may be above or below the upper electrode are formed in sequence. An area A where the air cavity 2, the lower electrode 4, the piezoelectric layer 5, the upper electrode 7 and the mass load layer 6-1 (or 6-2) overlap is an effective area of the resonator. A total thickness of the effective area part above the air cavity 2 determines the resonant frequency of the resonator.

Generally, in order to avoid increasing a process complexity, films of the seed layer 3, the lower electrode 4, the piezoelectric layer 5 and the upper electrode 7 selected in the filter manufacturing process are all sputtered or deposited on a whole surface of a wafer. Therefore, film thicknesses of the seed layer 3, the lower electrode 4, the piezoelectric layer 5 and the upper electrode 7 are the same in different resonator units. The filter manufacturing process usually adjusts the total thickness of the effective area only by changing the mass load layer 6-1 or 6-2 on different resonators, so as to obtain resonators with different resonant frequencies.

In some filter designs that require high out-passband consistency, it is often needed to arrange a plurality of mass loads with different thicknesses, such as 6-1, 6-2, 6-3 . . . 6-N, on different resonators. In order to facilitate the process and consider an etching selection ratio, a common practice is to form mass loads with different thicknesses by film layer overlay growth. That is, first, a first mass load layer with a thickness M1 grows on the whole surface of the wafer, then a photolithography and etching process is used to remove the mass load on resonators that do not need the first mass load, after removing the photoresist, a second mass load layer with a thickness M2 grows, and then the photolithography and etching process may be used to form mass loads having different thicknesses 0, M2 and M1+M2 on different resonators. Similarly, by repeating the above process, more mass loads 6-1, 6-2, 6-3 . . . 6-N having different thicknesses may be obtained.

However, forming a mass load with electrode material is equivalent to increasing a thickness of the electrode, which may have a negative impact on an effective electromechanical coupling coefficient (kt2eff) of the resonator itself.

Moreover, the electrode material film is generally prepared by sputtering equipment, such that a film-forming uniformity is limited. With a gap of about 5 A in the film thickness, the resonant frequency of the resonator may differ to about 1 MHz. Therefore, it is difficult to effectively improve the chip yield under the existing technologies.

In addition, in order to design filters with higher out-band suppression and flatter insertion loss curve, cascaded resonators with similar resonant frequencies are often used. Therefore, mass load thicknesses of the resonators will be very close, which means that the film thickness of part of the mass load above is very thin. Taking piezoelectric material ALN and electrode and mass load material molybdenum (Mo) as an example, if it is designed that a resonant frequency difference is 10 MHz, then the thickness of a certain mass load layer is close to 50 A. However, when the required mass load film thickness is less than 100 A, the film thickness is close to a range limit of measurement equipment, and a measurement error may not meet the process requirements. In addition, due to an influence of film-forming uniformity and etching uniformity, the manufacturing yield of the filter will only be lower.

Therefore, how to improve the manufacturing yield of the filter is still an urgent problem to be solved for improving the effective electromechanical coupling coefficients of each resonator, and making the out-band suppression of the filter higher and the insertion loss curve flatter.

The present disclosure provides a bulk acoustic wave filter a method of manufacturing the bulk acoustic wave filter, including:

forming an acoustic reflection air cavity, a sacrificial layer, a seed layer, a lower electrode layer and a piezoelectric layer of n resonators on a substrate in sequence, wherein n is greater than or equal to 2;

taking N from 1 to n for respectively repeating:

forming an N-th metal hard mask layer, defining an effective area of a first resonator to an N-th resonator by using a photolithography process, removing the N-th metal hard mask layer outside the effective area of the first resonator to the N-th resonator, oxidizing the piezoelectric layer outside the effective area of the first resonator to the N-th resonator to form an N-th oxidized part of the piezoelectric layer, and etching the N-th oxidized part of the piezoelectric layer;

removing the metal hard mask layer of the effective area of the first resonator to the N-th resonator, so as to form the piezoelectric layer having different thicknesses of the first resonator to the N-th resonator; and forming an upper electrode layer on the piezoelectric layer having different thicknesses of the first resonator to the N-th resonator.

Various resonators with different resonant frequencies may be obtained by directly forming the piezoelectric layer having different thicknesses, which may directly reduce the FBAR electrode thickness, increase the effective electromechanical coupling coefficient (kt2eff) of the resonator, significantly improve the thickness uniformity of the effective area of the whole wafer resonator and improve the manufacturing yield of the filter.

In one embodiment, referring to FIGS. 5-21, the method for manufacturing the bulk acoustic wave filter includes following steps.

In step S001, an acoustic reflection air cavity 2 of various resonators 201-1, 201-2, 201-3 of a filter 201 is formed on a substrate 1. Specifically, the acoustic reflection air cavity 2 may be formed by photolithography, dry etching process or wet etching process.

In step S002, a sacrificial layer is formed on the substrate 1 to completely fill the acoustic reflection air cavity 2. A material of the sacrificial layer includes phosphorus doped silicon oxide (PSG), metal or polymer. The material of the sacrificial layer may be deposited on the substrate 1 by sputtering process, chemical vapor deposition (CVD) process, physical vapor deposition (PVD) process, spin coating or other similar processes.

In step S003, a surface of the substrate is ground by CMP process, so that the sacrificial layer on an upper surface of the substrate is removed, and the upper surface of the sacrificial layer in the acoustic reflection air cavity is in the same plane with the upper surface of the substrate outside the acoustic reflection air cavity, that is, the upper surfaces of the two are flush.

Figure 6:
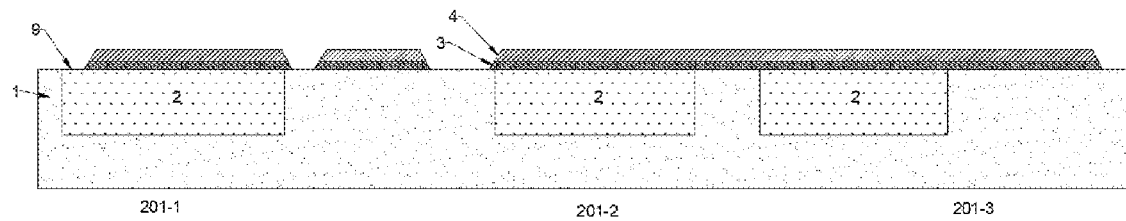

In step S004, as shown in FIG. 6, a seed layer 3 is formed on the upper surface of the substrate, and a lower electrode layer 4 is formed on the seed layer. A material of the seed layer may be AlN, and a material of the lower electrode layer may be molybdenum. Parts of the material of the lower electrode layer and the material of the seed layer is removed by photolithography and etching process to form a lower electrode pattern, and a metal pattern for coupling an upper electrode is reserved (so as to ensure that the upper and lower electrode metals are coupled in the same plane, which is conducive to testing and subsequent electrical coupling). The lower electrode pattern covers the acoustic reflection air cavity, but at least exposes an air cavity releasing channel 9. In particular, when etching the material molybdenum of the lower electrode layer, the photoresist may be used to define the lower electrode pattern, and then the dry etching process is used. The etching gases include $SF_6$ (sulfur hexafluoride) and $O_2$ (oxygen), and an etching selection ratio of molybdenum to AlN exceeding 100:1 may be obtained. By adjusting a proportion of the etching gas $O_2$, an etching rate of the photoresist is greater than an etching rate of the molybdenum. The photoresist is etched by $O_2$ plasma and gradually shrinks inward to form a slope shaped lower electrode etching morphology. The slope shaped lower electrode etching morphology (optionally, with a slope gradient 15°-20°) is conducive to a growth of a subsequent piezoelectric layer according to a crystal direction of a Z axis, improving an electromechanical coupling coefficient of a material of the piezoelectric layer.

Figure 7:
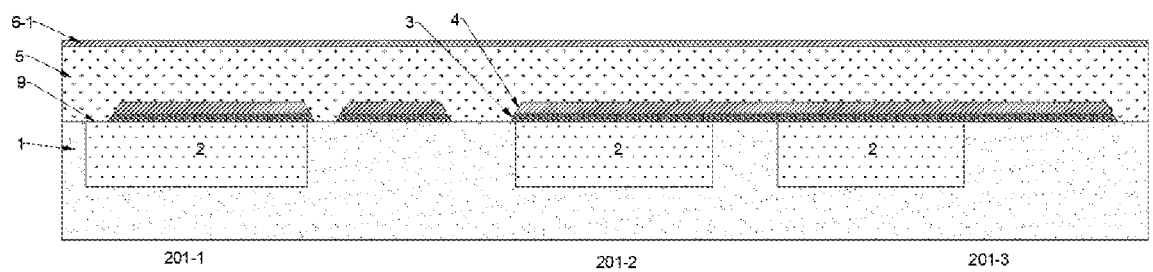

In step S005, as shown in FIG. 7, a piezoelectric layer 5 is formed on the lower electrode layer. In this embodiment, the piezoelectric layer is an AlN layer with z-axis crystal direction grown by magnetron sputtering.

In step S006, as shown in FIG. 7, a first metal hard mask layer 6-1 is formed on the piezoelectric layer. The first metal hard mask layer is a metal layer that may not be etched by HF (hydrofluoric acid), and in an etching removal process, the etching selection ratio of the metal to AlN is high. In this embodiment, a material of the first metal hard mask layer is optionally molybdenum.

Figure 8:
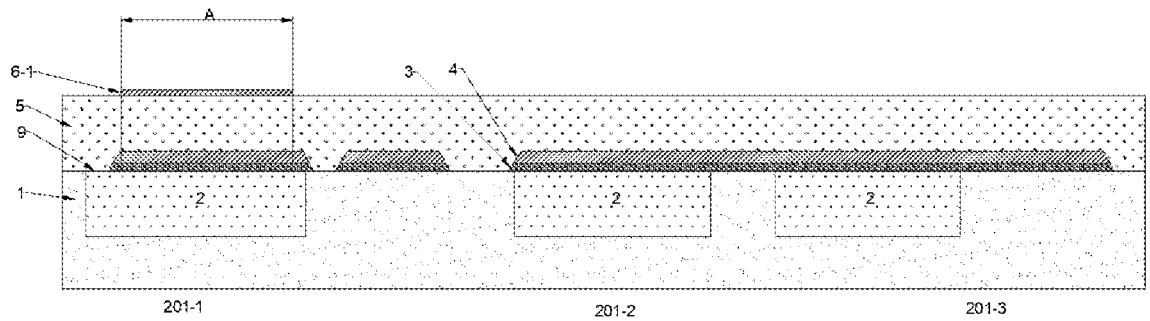

In step S007, as shown in FIG. 8, an effective area of the first resonator 201-1 is defined by the photolithography process, and the first metal hard mask layer 6-1 (molybdenum) outside the effective area of the first resonator 201-1 is removed by using the method for etching molybdenum in step S004 (etching selection ratio to AlN is greater than 100:1 when etching molybdenum).

Figure 9:
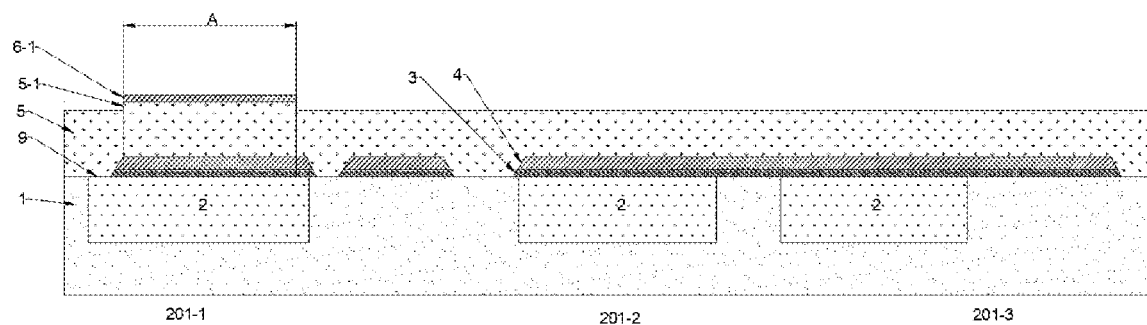

In step S008, as shown in FIG. 9, the chip (i.e. bulk acoustic wave filter chip) processed after step S007 is placed in an $O_2$ plasma environment for photoresist removal. At the same time, a surface of the piezoelectric layer in other areas not protected by the first metal hard mask layer 6-1 may be oxidized to form a first oxidized part of the piezoelectric layer. Specifically, different thicknesses of the oxidized part of the piezoelectric layer may be obtained by controlling a temperature of the $O_2$ plasma and a treatment time, and then the chip may be put into a diluted HF solution to etch the oxidized part of the piezoelectric layer. Experiments show that HF has strong etching ability for the oxidized piezoelectric layer, but almost no etching ability for the non-oxidized AlN. Therefore, through an $O_2$ plasma treatment with a uniform temperature, an oxidized part of the piezoelectric layer with a uniform thickness may be obtained on the whole chip, and a first piezoelectric layer step 5-1 with a uniform height may be obtained on the whole chip after HF etching. In order to obtain a more uniform piezoelectric layer step, a required oxidizing thickness for the piezoelectric layer may be obtained at one time by experimental method. Then a required piezoelectric layer step may be obtained by one-time etching. The required piezoelectric layer step may also be obtained by repeated oxidation, etching and thickness measurement steps as required.

Figure 10:
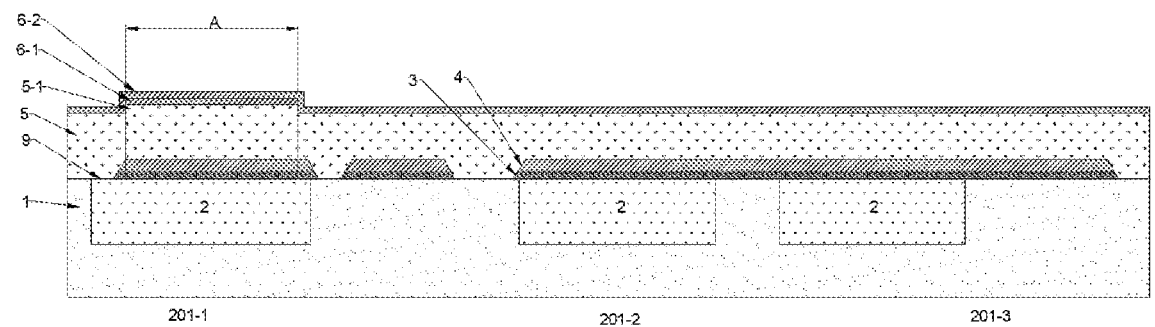

In step S009, as shown in FIG. 10, a second metal hard mask layer 6-2 is sputtered on the chip after the first piezoelectric layer step is formed.

Figure 11:
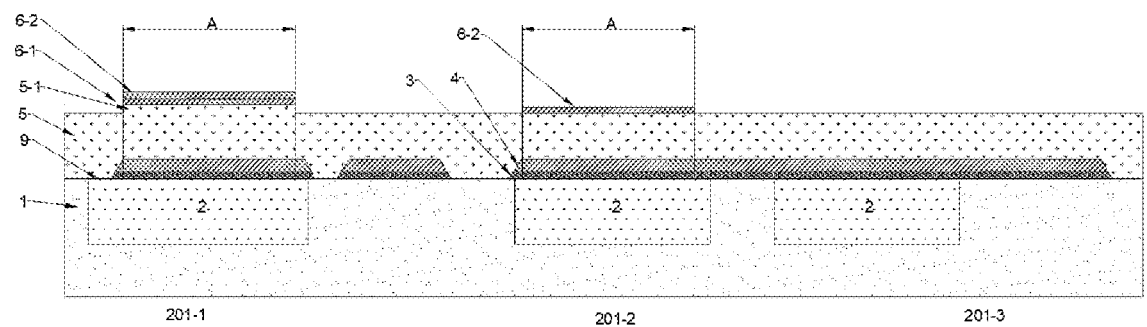

In step S010, as shown in FIG. 11, an effective area of the first resonator 201-1 and the second resonator 201-2 is defined by the photolithography process, and the molybdenum outside the effective area of the first resonator 201-1 and the second resonator 201-2 is removed by using the method for etching molybdenum in step S004 (etching selection ratio to AlN is greater than 100:1 when etching molybdenum).

Figure 12:
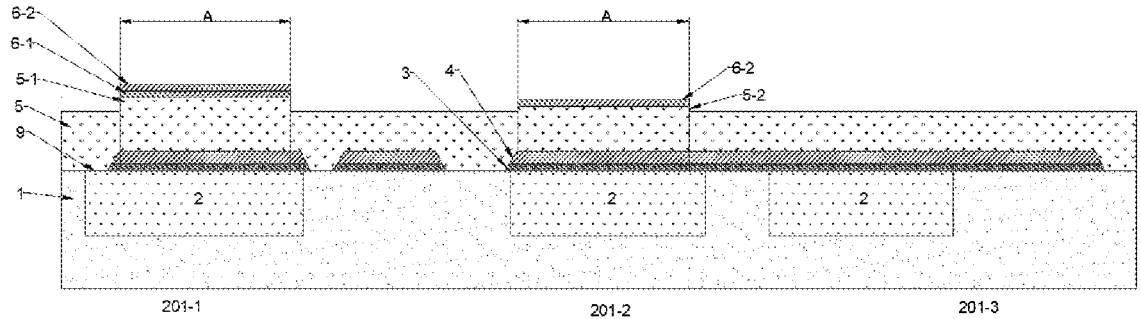

In step S011, as shown in FIG. 12, the piezoelectric layer is oxidized and etched with HF in the same manner as in step S008, a new first piezoelectric layer step 5-1 is formed on the first resonator 201-1, and a second piezoelectric layer step 5-2 is formed on the second resonator 201-2.

Figure 13:
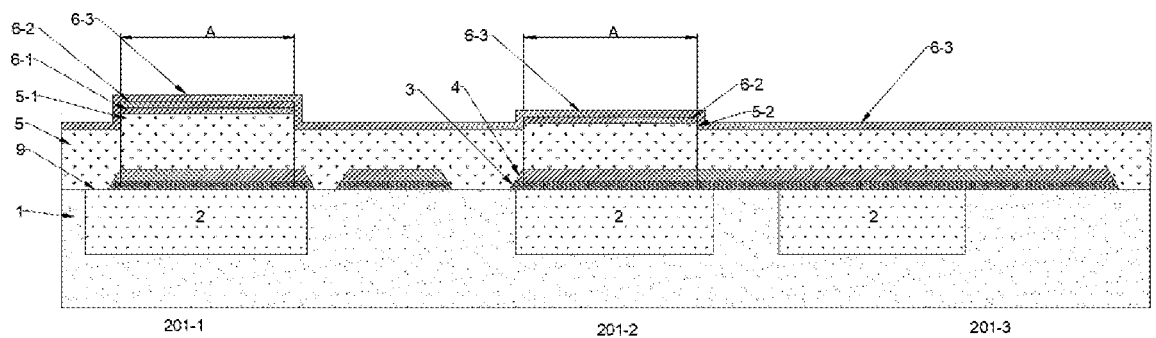

In step S012, as shown in FIG. 13, a third metal hard mask layer 6-3 is sputtered again on the chip processed in step S011.

Figure 14:
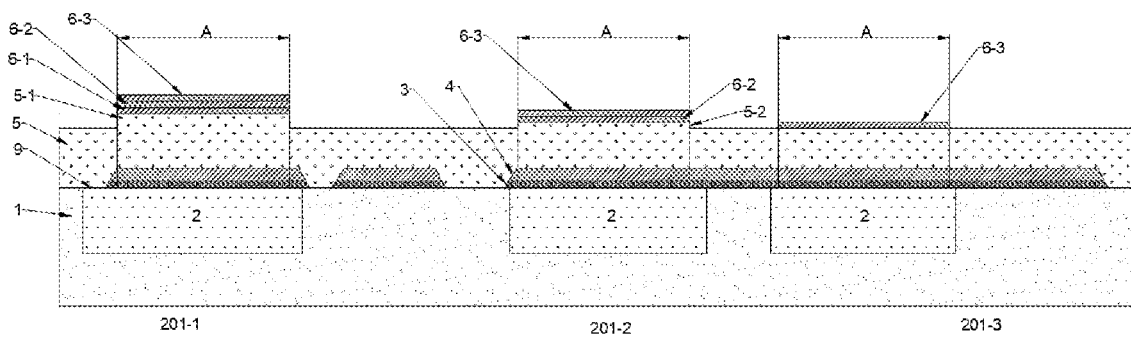

In step S013, as shown in FIG. 14, an effective area of the first resonator 201-1, the second resonator 201-2 and the third resonator 201-3 is defined by the photolithography process, and the molybdenum outside the effective area of the first resonator 201-1, the second resonator 201-2 and the third resonator 201-3 is removed by using the method for etching molybdenum in step S004 (etching selection ratio to AlN is greater than 100:1 when etching molybdenum).

Figure 15:
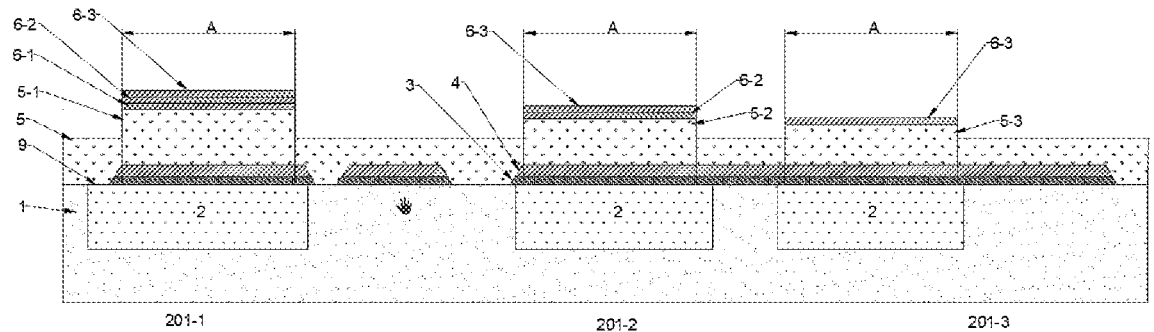

In step S014, as shown in FIG. 15, the piezoelectric layer is oxidized and etched with HF in the same manner as in step S008, a new first piezoelectric layer step 5-1 is formed on the first resonator 201-1, a new second piezoelectric layer step 5-2 is formed on the second resonator 201-2, and a third piezoelectric layer step 5-3 is formed on the third resonator 201-3.

In step S015, if the bulk acoustic wave filter includes more resonators, then accordingly, the steps S012-S014 may be repeated to obtain more different piezoelectric layer steps 5-1, 5-2, 5-3 . . . 5-N, so as to form more resonators with different resonant frequencies. That is, the present disclosure is not limited to only three resonators and may be adjusted according to specific needs.

Figure 16:
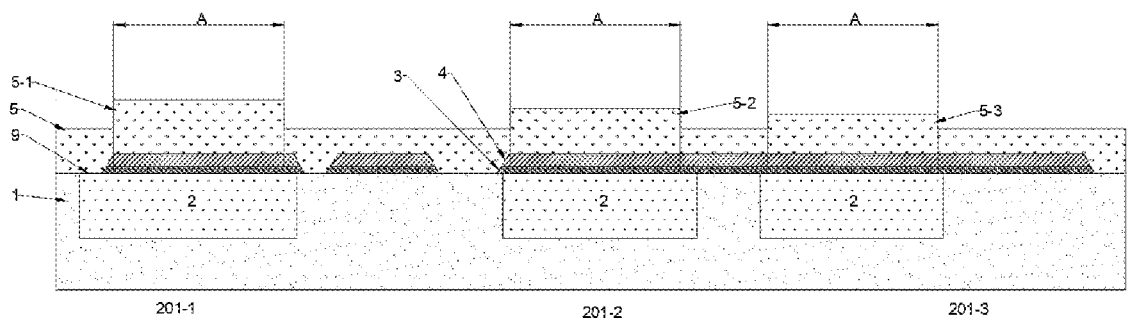

In step S016, as shown in FIG. 16, the metal hard mask layers 6-1, 6-2 and 6-3 are removed by using the method for etching molybdenum in step S004 (etching selection ratio to AlN is greater than 100:1 when etching molybdenum), that is, the piezoelectric layer having different piezoelectric layer thicknesses of various resonators is obtained.

Figure 17:
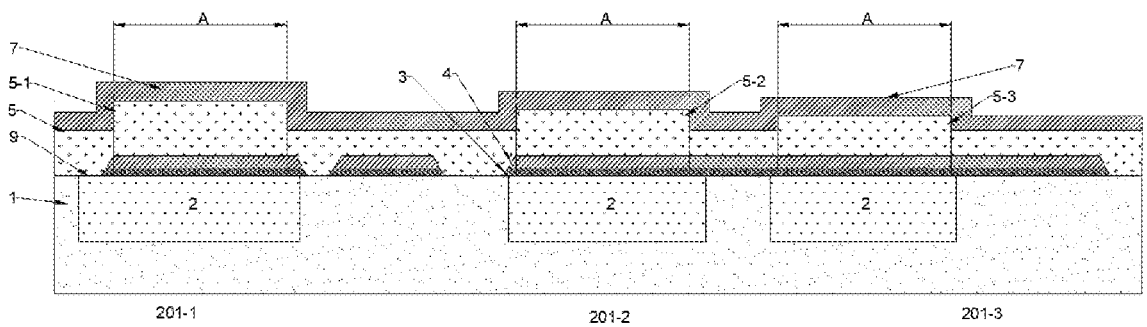

In step S017, as shown in FIG. 17, an upper electrode layer 7 is sputtered on the piezoelectric layer having different piezoelectric layer steps 5-1, 5-2, 5-3 . . . 5-N. A material of the upper electrode layer may be conductive metals such as molybdenum and aluminum. In this embodiment, the material of the upper electrode layer is optionally molybdenum.

Figure 18:
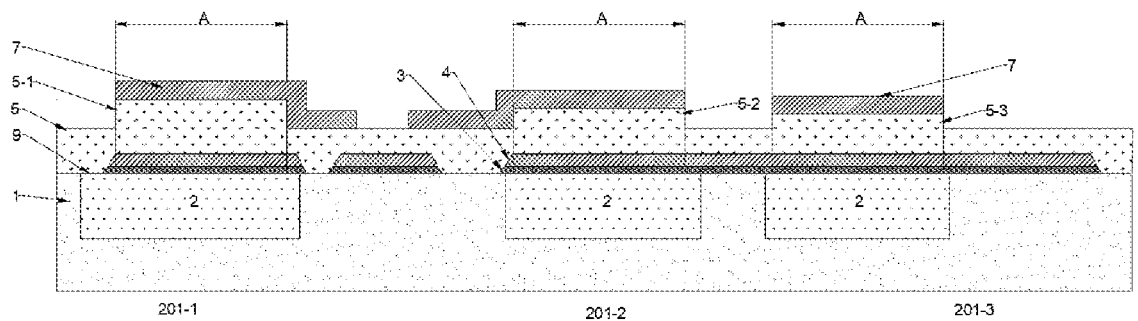

In step S018, as shown in FIG. 18, an upper electrode pattern of each resonator is formed by photolithography.

Figure 19:
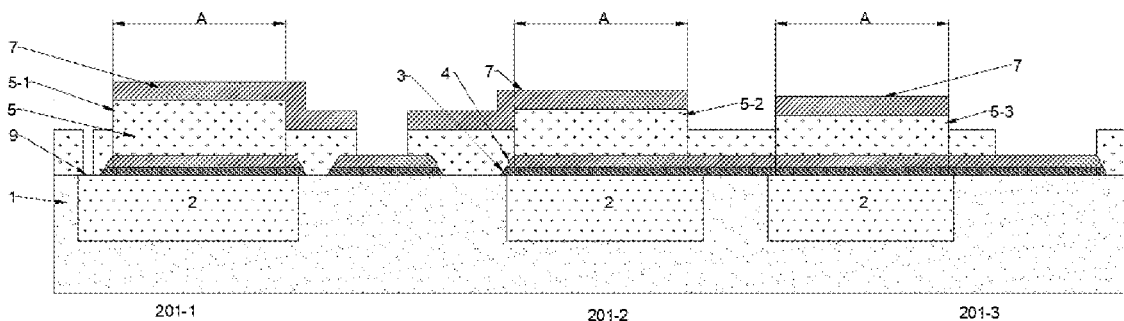

In step S019, as shown in FIG. 19, an area where the upper and lower electrodes need to be electrically coupled is defined by the photolithography process, and the piezoelectric layer above the area where the lower electrode needs to be electrically coupled and the area reserved for the upper electrode for electrical coupling are all removed, and the air cavity releasing channel 9 with the sacrificial layer removed is exposed at the same time. In addition, it is also possible to etch only the AlN on the area where the upper and lower electrodes electrically coupled and the AlN on the air cavity releasing channel of the sacrificial layer by windowing, and the AlN in other areas is retained.

Figure 20:
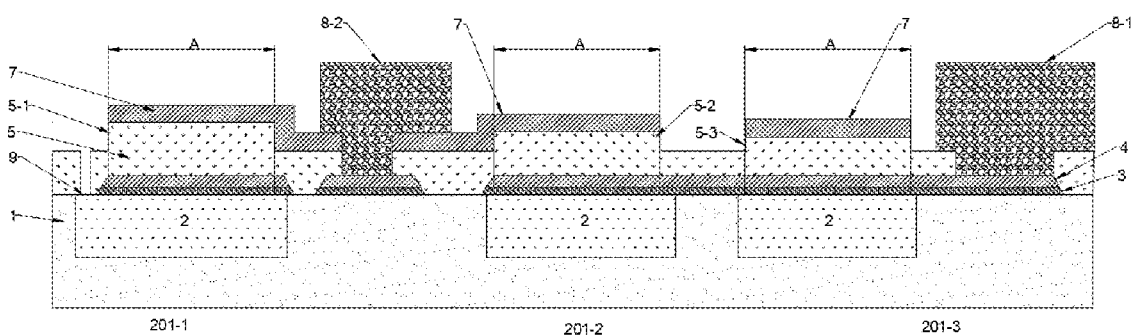

In step S020, as shown in FIG. 20, an electrical coupling layer 8-1 is formed on the lower electrode and an electrical coupling layer 8-2 is formed on the upper electrode. The electrical coupling layers may be one or more layers of metal formed by TIW, AL, Cu, Au, Cr, etc. with good conductivity.

Figure 21:
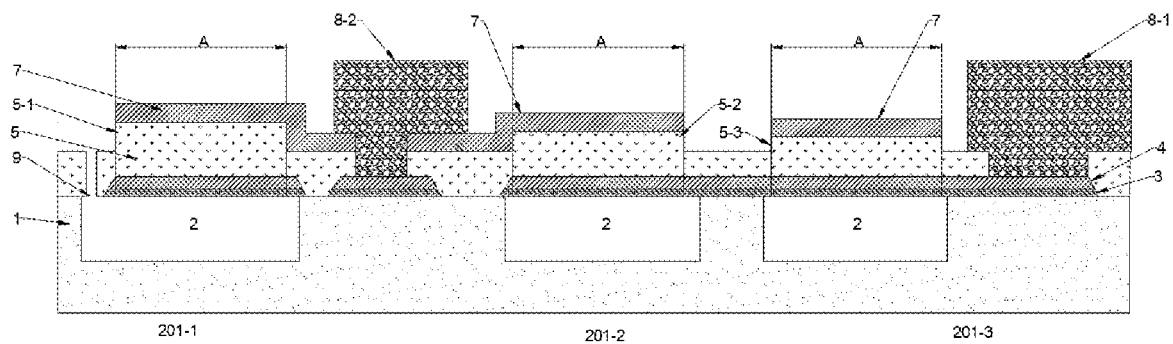

In step S021, as shown in FIG. 21, the material of the sacrificial layer is released and removed by HF through the air cavity releasing channel 9 to form the acoustic reflection air cavity 2.

The present disclosure also provides a bulk acoustic wave filter, which is manufactured by the manufacturing method.

In addition, the above definition of each element and method is not limited to various specific structures, shapes or modes mentioned in the embodiment, which may be simply changed or replaced by those skilled in the art, for example:

In addition, the present disclosure is also applicable to the solidity mounted resonator SMR.

The bulk acoustic wave filter and the method for manufacturing the bulk acoustic wave filter have at least one of following beneficial effects:

(1) Resonators with different resonant frequencies are obtained by directly forming different piezoelectric layer thicknesses, which may greatly reduce the thickness of the electrode layer and effectively improve the effective electromechanical coupling coefficient (kt2eff) of each resonator.

(2) The acoustic velocity of piezoelectric layer AlN is higher than that of molybdenum electrode, such that an influence of AlN on frequency is less than that of molybdenum for the same thickness change. Therefore, by adjusting the frequency using AlN thickness, the process controllability is much higher than that using molybdenum. As mentioned before, the molybdenum thickness change of 5 A may change the frequency by 1 MHz, while the AlN thickness change of about 10 A may cause the frequency change by 1 MHz.

(3) The piezoelectric layer AlN is a transparent material, generally adopting an optical principle in its thickness measurement method, so that the measurement accuracy is much higher than that of molybdenum thickness. Moreover, the total thickness of the piezoelectric layer is close to half of a wavelength of a filtering signal. Calculated according to the frequency of the existing communication frequency band, the thickness is generally in an order of more than thousands of angstroms, which is a middle part of a range of an existing optical measurement equipment. Thus, the measurement reliability is greatly improved.

(4) In the molybdenum etching method provided by the present disclosure, the etching selection ratio of molybdenum to AlN is greater than 100:1. By using molybdenum as the hard mask layer and the electrode layer, the etching process hardly damages AlN, and the influence of etching un-uniformity on the frequency of the whole chip becomes very small.

(5) According to the present disclosure, AlN is oxidized first and then the diluted HF is used for etching. This may accurately control the thickness of AlN oxidation to the order of less than 40 A. Moreover, using the characteristic that HF has no etching ability for the non-oxidized AlN, an over etching amount of wet etching has little impact on the process result, so the etching process is highly controllable and reliable. In combination with accurate AlN thickness measurement, the AlN step height may be fine tuned many times without remaking the mask layer, by using the method for oxidizing, etching, measurement, re-oxidizing, re-etching, re-measurement . . . . This may accurately control the thicknesses of the piezoelectric layer of different resonators.

(6) In the oxidizing method and wet etching method provided by the disclosure, the whole chip is placed in the same uniform environment, so that the thickness uniformity and etching uniformity of the oxide film are very high, and the frequency uniformity of the whole chip is significantly improved.

(7) According to the piezoelectric layer etching method provided by the disclosure, the piezoelectric layer of different resonators may have very close thicknesses, so that different resonators with very close resonant frequencies may be obtained, which may realize a relatively gentle filter in-band and out-band insertion loss curves, and may realize a filter device with lower insertion loss and higher suppression.

(8) The manufacturing method of the bulk acoustic wave filter has the advantages of simple process and low cost, which is suitable for forming a bulk acoustic wave filter with a plurality of resonators with different piezoelectric layer thicknesses, and has no limit on the specific number of resonators.

It should be noted that in the drawings or description of the specification, similar or identical parts use the same drawing number. The technical features in each embodiment of the examples in the description may be freely combined to form a new scheme with no conflict. In addition, each claim may be taken as an embodiment alone or the technical features in each claim may be combined as a new embodiment, and in the drawings, the shape or thickness of the embodiment may be expanded, and marked with simplification or convenience. Moreover, the elements or implementations not shown or described in the drawings are in a form known to those skilled in the art. In addition, although the present disclosure may provide an example of a parameter containing a specific value, it should be understood that the parameter does not need to be exactly equal to the corresponding value, but may approximate the corresponding value within acceptable error tolerance or design constraints.

Unless there are technical obstacles or contradictions, the above various embodiments of the present disclosure may be freely combined to form other embodiments, which are within the protection scope of the present disclosure.

Although the present disclosure is described in combination with the accompanying drawings, the embodiments disclosed in the accompanying drawings are intended to illustrate the optional embodiments of the present disclosure, and should not be understood as a limitation of the present disclosure. The size scale in the drawings is only schematic and should not be understood as a limitation of the present disclosure.

Although some embodiments of the general concept of the present disclosure have been shown and described, those skilled in the art will understand that these embodiments may be changed without departing from the principle and spirit of the general concept of the present invention, and the scope of the present disclosure is limited by the claims and their equivalents.

What is claimed is:

1. A method for manufacturing a bulk acoustic wave filter, comprising:
   forming an acoustic reflection air cavity, a sacrificial layer, a seed layer, a lower electrode layer and a piezoelectric layer of n resonators on a substrate in sequence, wherein n is greater than or equal to 2;
   taking N from 1 to n for respectively repeating following steps:
   forming an N-th metal hard mask layer,
   defining an effective area of a first resonator to an N-th resonator by using a photolithography process,
   removing the N-th metal hard mask layer outside the effective area of the first resonator to the N-th resonator,
   oxidizing the piezoelectric layer outside the effective area of the first resonator to the N-th resonator to form an N-th oxidized part of the piezoelectric layer, and
   etching the N-th oxidized part of the piezoelectric layer;
   removing the N-th metal hard mask layer of the effective area of the first resonator to the N-th resonator, so as to form the piezoelectric layer having different thicknesses of the first resonator to the N-th resonator; and
   forming an upper electrode layer on the piezoelectric layer having different thicknesses of the first resonator to the N-th resonator.

2. The method according to claim 1, wherein an effective area pattern of the first resonator to the N-th resonator is defined by using a photoresist when forming the N-th metal hard mask layer; and the photoresist is removed by using an $O_2$ plasma environment, and the piezoelectric layer outside the effective area of the first resonator to the N-th resonator is oxidized to form the N-th oxidized part of the piezoelectric layer.

3. The method according to claim 2, wherein a thickness of the oxidized part of the piezoelectric layer is changed by controlling a temperature of the $O_2$ plasma and a treatment time, and the oxidized part of the piezoelectric layer is etched by HF.

4. The method according to claim 1, wherein after the N-th metal hard mask layer outside the effective area of the first resonator to the N-th resonator is removed, the N-th oxidized part of the piezoelectric layer is formed and etched for a plurality of times, and a thickness of the piezoelectric layer is measured after each etching.

5. The method according to claim 1, wherein
   after the acoustic reflection air cavity is formed, the sacrificial layer is formed on the substrate, an upper surface of the sacrificial layer in the acoustic reflection air cavity is in the same plane with an upper surface of the substrate outside the acoustic reflection air cavity by using a CMP process, and then the seed layer and the lower electrode layer are formed on the upper surface of the sacrificial layer; and
   parts of a material of the lower electrode layer and a material of the seed layer are removed by using a photolithography and etching process to form a lower electrode pattern, the lower electrode pattern is defined by using the photoresist when etching the material of the lower electrode layer, and then a dry etching process is used, wherein etching gases include $SF_6$ and $O_2$, an etching rate of the photoresist is greater than an etching rate of the lower electrode layer by adjusting a proportion of the etching gas $O_2$, the photoresist is etched by an $O_2$ plasma and gradually shrinks inward to form a slope shaped lower electrode etching morphology, wherein a slope gradient of the slope is 15°-20°.

6. The method according to claim 5, further comprising: after forming the upper electrode layer,
   defining an area where the upper electrode is electrically coupled to the lower electrode by the photolithography process, removing the piezoelectric layer of the area where the upper electrode is electrically coupled to the lower electrode, and exposing an air cavity releasing channel with the sacrificial layer removed.

7. The method according to claim 6, further comprising:
after exposing the air cavity releasing channel with the sacrificial layer removed,
forming electrical coupling layers on the lower electrode and the upper electrode respectively.

8. The method according to claim 7, wherein a material of the sacrificial layer comprises phosphorus doped silicon oxide, metal or polymer; a material of the seed layer and the piezoelectric layer comprises AlN; a material of the lower electrode layer and the metal hard mask layer material comprises molybdenum; a material of the upper electrode layer comprises molybdenum or aluminum, and a material of the electrical coupling layer comprises TiW, Al, Cu, Au or CR.

9. The method according to claim 5, wherein,
the acoustic reflection air cavity is formed by the photolithography, dry etching or wet etching process;
the sacrificial layer is formed by sputtering, chemical vapor deposition, physical vapor deposition, or spin coating process; and
the seed layer and the lower electrode layer are formed by a sputtering process.

* * * * *